US009992571B2

(12) United States Patent
Hu et al.

(10) Patent No.: US 9,992,571 B2
(45) Date of Patent: Jun. 5, 2018

(54) SPEAKER PROTECTION FROM OVEREXCURSION

(71) Applicant: Cirrus Logic International Semiconductor Ltd., Edinburgh (GB)

(72) Inventors: Rong Hu, Austin, TX (US); Zheng Yan, Austin, TX (US); Jie Su, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 15 days.

(21) Appl. No.: 15/149,987

(22) Filed: May 9, 2016

(65) Prior Publication Data

US 2017/0325024 A1 Nov. 9, 2017

(51) Int. Cl.

*H03G 11/00* (2006.01)
*H04R 3/00* (2006.01)
*H04R 29/00* (2006.01)

(52) U.S. Cl.

CPC ........... *H04R 3/007* (2013.01); *H04R 29/001* (2013.01)

(58) Field of Classification Search

CPC .......... H04R 3/007; H04R 3/00; H04R 29/00; H04R 29/001; H04R 29/002
USPC ............................................... 381/55, 59, 96
See application file for complete search history.

(56) References Cited

U.S. PATENT DOCUMENTS

| | | | |
|---|---|---|---|
| 9,161,126 B2 | 10/2015 | Su et al. | |
| 9,173,027 B2 | 10/2015 | Su | |
| 2010/0316226 A1* | 12/2010 | Yoneda | H04R 3/002 381/59 |
| 2011/0235824 A1* | 9/2011 | Lehnert | H03G 9/005 381/94.8 |
| 2012/0106750 A1* | 5/2012 | Thormundsson | H04R 3/007 381/71.12 |
| 2012/0281844 A1 | 11/2012 | Luo et al. | |
| 2014/0254805 A1 | 9/2014 | Su et al. | |
| 2015/0086025 A1 | 3/2015 | Oyetunji | |
| 2015/0124982 A1 | 5/2015 | Berthelsen et al. | |

FOREIGN PATENT DOCUMENTS

| | | |
|---|---|---|
| EP | 2355542 A1 | 8/2011 |
| EP | 2538699 A1 | 12/2012 |
| WO | 2015041765 A1 | 11/2012 |

OTHER PUBLICATIONS

Luo, Chenchi et al., A Model based excursion protection algorithm for loudspeakers, pp. 233-236, ICASSP 2012.
Corey, Jason, Audio Production and Critical Listening—Technical Ear Training, pp. 111-112, Focal Press, Taylor & Francis Group, 2013.

(Continued)

*Primary Examiner* — Xu Mei
(74) *Attorney, Agent, or Firm* — Jackson Walker L.L.P.

(57) ABSTRACT

In accordance with embodiments of the present disclosure, a controller configured to be coupled to an audio transducer, may be further configured to receive an audio input signal, calculate a displacement compensation signal in a displacement domain of the audio transducer based on the audio input signal, convert the displacement compensation signal from the displacement domain into a voltage compensation signal in a voltage domain, and apply the voltage compensation signal to the audio input signal, or a derivative thereof, to minimize overexcursion of the audio transducer.

15 Claims, 2 Drawing Sheets

(56) References Cited

OTHER PUBLICATIONS

Klippel, Wolfgang, "The mirror filter—a new basis for linear equalization and nonlinear distortion reduction of woofer systems," the 92nd AES Convention, Mar. 1992.
Blesser, Barry A. et. al., "Audio dynamic range compression for minimum perceived distortion", IEEE Trans. On Audio and Electroacoustics, pp. 22-32, vol. AU-17, No. 1, Mar. 1969.
Combined Search and Examination Report under Sections 17 and 18(3), Application No. GB1610241.0, dated Aug. 8, 2016, 6 pages.

* cited by examiner

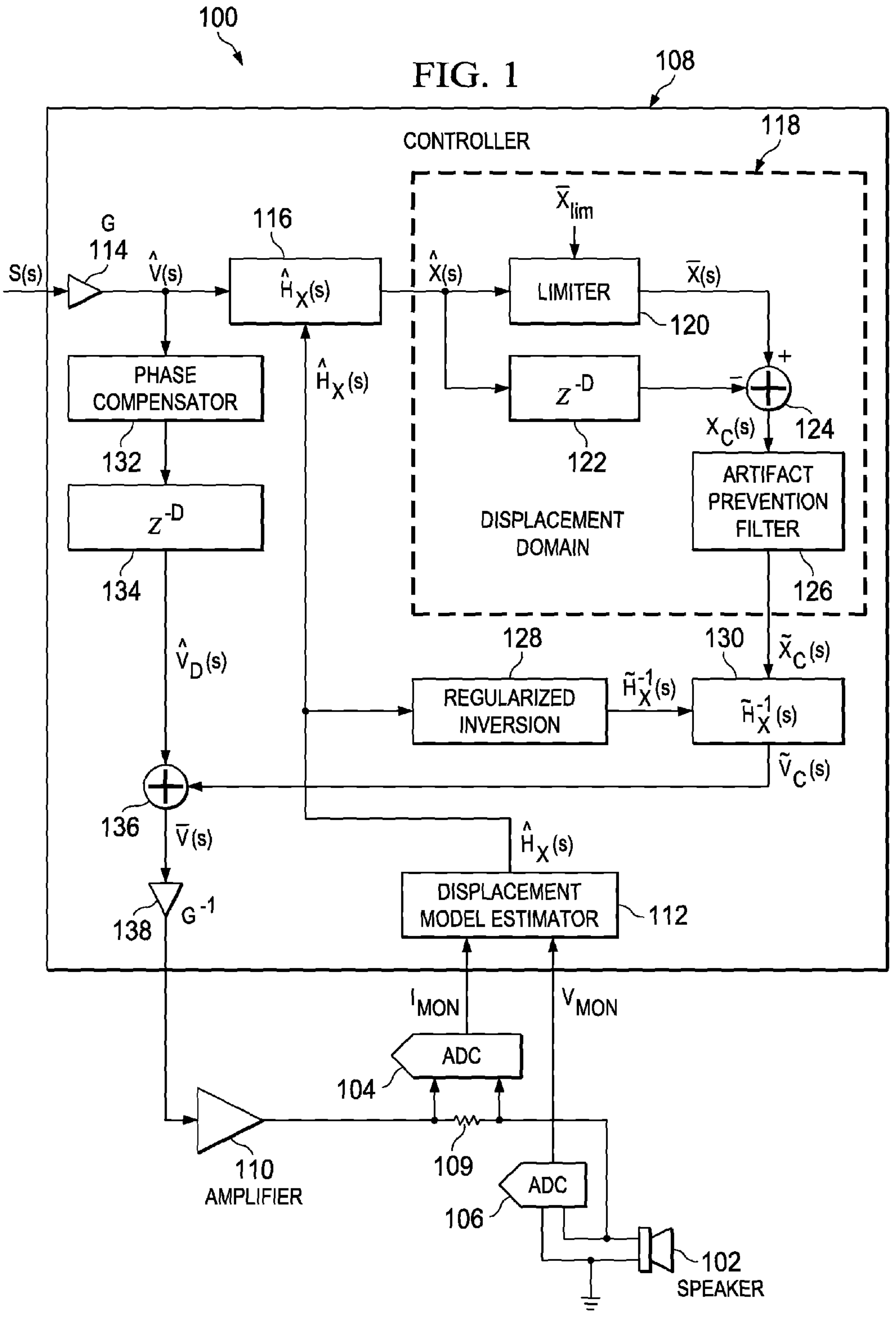
100
FIG. 1
108
CONTROLLER
118
$\bar{X}_{lim}$
G
114
116
S(s)
$\hat{V}(s)$
$\hat{H}_X(s)$
$\hat{X}(s)$
LIMITER
$\bar{X}(s)$
120
PHASE COMPENSATOR
$\hat{H}_X(s)$
$z^{-D}$
+
-
124
$X_C(s)$
132
122
ARTIFACT PREVENTION FILTER
$z^{-D}$
DISPLACEMENT DOMAIN
134
126
128
130
$\hat{V}_D(s)$
$\tilde{X}_C(s)$
REGULARIZED INVERSION
$\tilde{H}_X^{-1}(s)$
$\tilde{H}_X^{-1}(s)$
$\tilde{V}_C(s)$
136
$\bar{V}(s)$
$\hat{H}_X(s)$
DISPLACEMENT MODEL ESTIMATOR
112
138
$G^{-1}$
$I_{MON}$
$V_{MON}$
ADC
104
110
AMPLIFIER
109
ADC
106
102
SPEAKER

SPEAKER PROTECTION FROM OVEREXCURSION

FIELD OF DISCLOSURE

The present disclosure relates in general to audio speakers, and more particularly, to compensating for overexcursion in a displacement domain of an audio control system in order to protect audio speakers from damage.

BACKGROUND

Audio speakers or loudspeakers are ubiquitous on many devices used by individuals, including televisions, stereo systems, computers, smart phones, and many other consumer devices. Generally speaking, an audio speaker is an electroacoustic transducer that produces sound in response to an electrical audio signal input.

Given its nature as a mechanical device, an audio speaker may be subject to damage caused by operation of the speaker, including overheating and/or overexcursion, in which physical components of the speaker are displaced too far a distance from a resting position. To prevent such damage from happening, speaker systems often include control systems capable of controlling audio gain, audio bandwidth, and/or other components of an audio signal to be communicated to an audio speaker.

However, existing approaches to speaker system control have disadvantages. For example, many such approaches apply gain attenuation, high-pass filtering, and notch filtering, and such approaches may have the disadvantages of inaccurate attenuation and over-attenuation, loss of low-frequency bass contents for high-pass filtering approaches, and the fact that timing of gain attenuation in the digital and/or voltage domain is difficult to achieve from a control standpoint.

SUMMARY

In accordance with the teachings of the present disclosure, certain disadvantages and problems associated with protecting a speaker from damage have been reduced or eliminated.

In accordance with embodiments of the present disclosure, a controller configured to be coupled to an audio transducer may be further configured to receive an audio input signal, calculate a displacement compensation signal in a displacement domain of the audio transducer based on the audio input signal, convert the displacement compensation signal from the displacement domain into a voltage compensation signal in a voltage domain, and apply the voltage compensation signal to the audio input signal, or a derivative thereof, to minimize overexcursion of the audio transducer.

In accordance with these and other embodiments of the present disclosure, a method may include receiving an audio input signal, calculating a displacement compensation signal in a displacement domain of an audio transducer based on the audio input signal, converting the displacement compensation signal from the displacement domain into a voltage compensation signal in a voltage domain, and applying the voltage compensation signal to the audio input signal, or a derivative thereof, to minimize overexcursion of the audio transducer.

In accordance with these and other embodiments of the present disclosure, an article of manufacture may include a non-transitory computer-readable medium and computer-executable instructions carried on the computer-readable medium, the instructions readable by a processor. The instructions, when read and executed, may cause the processor to receive an audio input signal, calculate a displacement compensation signal in a displacement domain of an audio transducer based on the audio input signal, convert the displacement compensation signal from the displacement domain into a voltage compensation signal in a voltage domain, and apply the voltage compensation signal to the audio input signal, or a derivative thereof, to minimize overexcursion of the audio transducer.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 illustrates a block diagram of an example system that uses speaker modeling and tracking to control operation of an audio speaker, in accordance with embodiments of the present disclosure.

DETAILED DESCRIPTION

Figure 2:
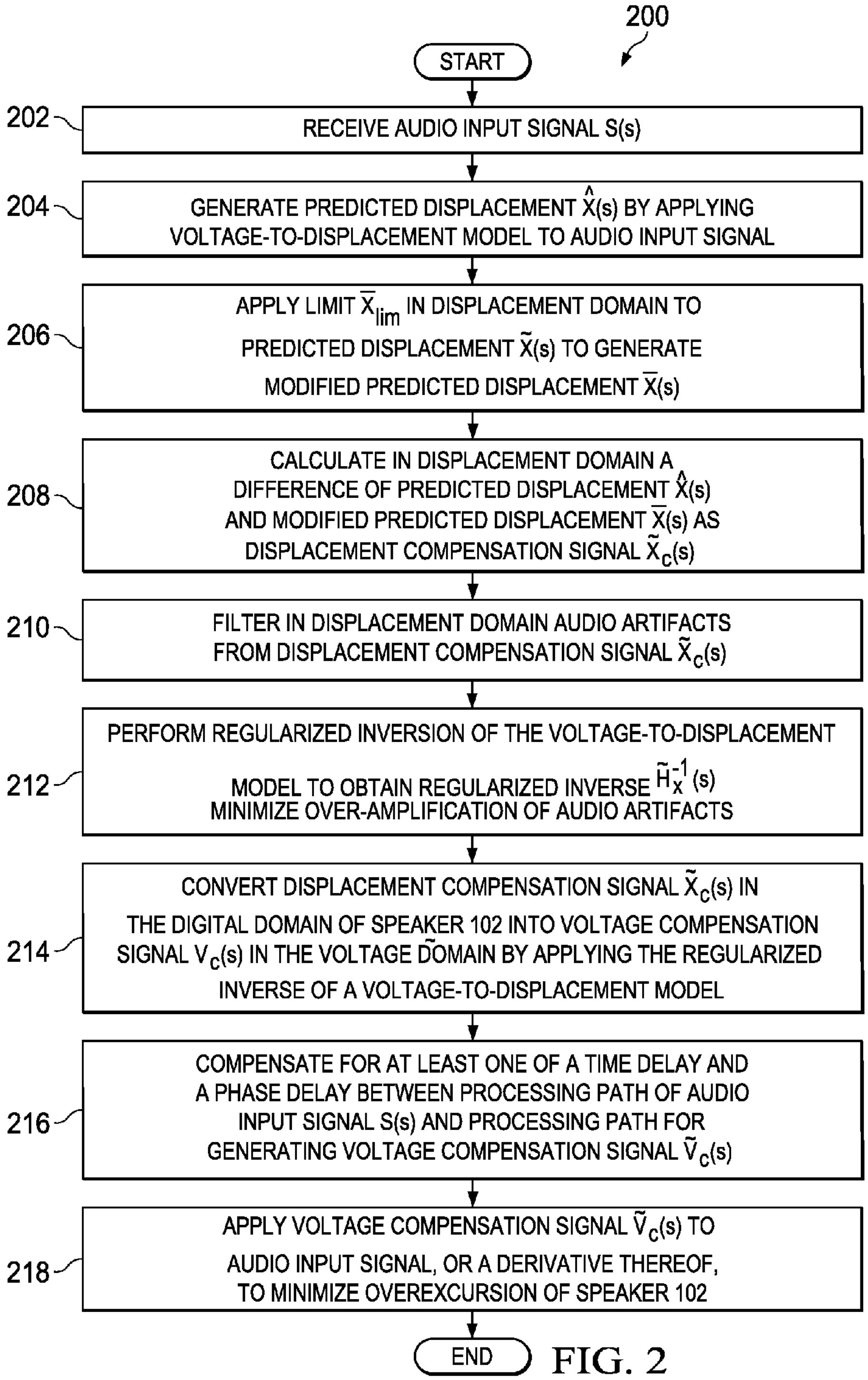
FIG. 2 illustrates a flow chart of an example method for speaker protection, in accordance with embodiments of the present disclosure.

FIG. 1 illustrates a block diagram of an example system 100 that employs a controller 108 to control the operation of an audio speaker 102, in accordance with embodiments of the present disclosure. Audio speaker 102 may comprise any suitable electroacoustic transducer that produces sound in response to an electrical audio signal input (e.g., a voltage or current signal). As shown in FIG. 1, controller 108 may generate such an electrical audio signal input, which may be further amplified by an amplifier 110. In some embodiments, one or more components of system 100 may be integral to a single integrated circuit (IC).

Amplifier 110 may be any system, device, or apparatus configured to amplify a signal received from controller 108 and communicate the amplified signal (e.g., to speaker 102). In some embodiments, amplifier 110 may comprise a digital amplifier configured to also convert a digital signal output from controller 108 into an analog signal to be communicated to speaker 102.

An electrical current driven by amplifier 110 may be sensed by a sensing resistor 109, the sensing resistor voltage of which may be sampled by an analog-to-digital converter 104 configured to convert such voltage into a digital current signal $I_{MON}$. Similarly, the audio signal communicated to speaker 102 by amplifier 110 may be sampled by an analog-to-digital converter 106 configured to convert such sampled voltage into a digital voltage signal $V_{MON}$.

Controller 108 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, controller 108 may interpret and/or execute program instructions and/or process data stored in a memory or other computer-readable medium (not explicitly shown) communicatively coupled to controller 108. As described in greater detail below, controller 108 may perform processing of an audio input signal S(s) in order to protect speaker 102 from overexcursion.

As shown in FIG. 1, controller 108 may include displacement model estimator 112. Displacement model estimator 112 may, based on digital current signal $I_{MON}$, digital voltage signal $V_{MON}$, and one or more other parameters (e.g., audio input signal driven to amplifier 110, an actual measured displacement of speaker 102, etc.), estimate an excursion transfer function $\hat{H}_x(s)$ which is a voltage-to-displacement model of speaker 102, such that when excursion transfer function $\hat{H}_x(s)$ is applied to a signal representing a voltage applied to speaker 102, the result is an estimated displacement of speaker 102.

Controller 108 may receive an audio input signal S(s) in the digital domain. A voltage-predicting gain element 114 may apply a gain G (e.g., a digital-to-analog gain) to audio input signal S(s), wherein the gain represents a gain of amplifier 110 (e.g. which may in some embodiments include a digital-to-analog converter having a digital-to-analog gain), to generate a predicted voltage signal $\hat{V}(s)$ which is a digital signal that represents an estimate of the voltage $V_{MON}$ that would be driven to speaker 102 in response to audio input signal S(s) in the absence of speaker protection. A filter 116 may apply excursion transfer function $\hat{H}_x(s)$ to the predicted voltage signal $\hat{V}(s)$ in a voltage domain to generate a predicted displacement $\hat{X}(s)$ in a displacement domain.

In a displacement domain 118 of controller 108, a limiter 120 (e.g., a digital dynamic compressor having fast or immediate attack settings) may apply a limit $\overline{X}_{lim}$ (wherein limit $\overline{X}_{lim}$ represents a maximum displacement for speaker 102) to predicted displacement $\hat{X}(s)$ to generate a modified (e.g., excursion-limited) predicted displacement $\overline{X}(s)$. A delay element 122 may delay predicted displacement $\hat{X}(s)$ to compensate for a look-ahead delay of limiter 120, and combiner 124 may subtract such predicted displacement $\hat{X}(s)$ (as delayed by delay element 122) from modified predicted displacement $\overline{X}(s)$ to generate a displacement compensation signal $X_c(s)$. An artifact prevention filter 126 may filter (e.g., using low-pass filtering with cutoff frequencies greater than the cutoff frequency of excursion transfer function $\hat{H}_x(s)$) displacement compensation signal $X_c(s)$ to remove audio artifacts from displacement compensation signal $X_c(s)$ in order to generate filtered displacement compensation signal $\tilde{X}_c(s)$. Thus, controller 108 is configured to calculate, in a displacement domain (e.g., displacement domain 118) of speaker 102 (e.g., as opposed to a voltage domain), a displacement compensation signal (e.g., $X_c(s)$ or $\tilde{X}_c(s)$) based on an audio input signal (e.g., S(s)). In addition, controller 108 may also be configured to filter audio artifacts from the displacement compensation signal.

A regularized inversion block 128 of controller 108 may regularize inversion of the voltage-to-displacement excursion transfer function $\hat{H}_x(s)$ to obtain an inverse transfer function $\tilde{H}_x^{-1}(s)$ which may avoid or minimize any over-amplification of audio artifacts that may otherwise occur if a direct inverse $\hat{H}_x^{-1}(s)$ of excursion transfer function $\hat{H}_x(s)$ were to be applied instead to convert displacement compensation signal $\tilde{X}_c(s)$ into a corresponding voltage signal. For example, frequency spectral regions with low magnitude content in excursion transfer function $\hat{H}_x^{-1}(s)$ may have high magnitude in its direct inverse transfer function $\hat{H}_x^{-1}(s)$ which may lead to undesirable results (e.g., over-amplification or audible perception of unpleasant artifacts, which may be caused by limiter 120) when applying such direct inverse transfer function $\hat{H}_x^{-1}(s)$ of excursion transfer function $\hat{H}_x(s)$ to displacement compensation signal $\tilde{X}_c(s)$. Accordingly, such potential artifacts may be attenuated or otherwise confined to remain inaudible filtered out or otherwise attenuated by instead applying by regularized inversion block 128 a regularized voltage-to-displacement inverse transfer function $\tilde{H}_x^{-1}(s)$. The regularized voltage-to-displacement inverse transfer function $\tilde{H}_x^{-1}(s)$ may simply be a regularized version of direct inverse transfer function $\hat{H}_x^{-1}(s)$. For example, in some embodiments, in the frequency domain:

$$\left|\tilde{H}_x^{-1}(f)\right| = \begin{cases} \dfrac{1}{|H_x(f)|}, & \text{if } |H_x(f)| > H_{Threshold} \\ 1/H_{Threshold}, & \text{otherwise} \end{cases};$$

where $H_{threshold}$ comprises an arbitrary threshold magnitude of the excursion transfer function $H_x(f)$ in the frequency-domain.

An inversion filter 130 may apply a regularized voltage-to-displacement inverse transfer function $\hat{H}_x^{-1}(s)$ to displacement compensation signal $\tilde{X}_c(s)$ to convert displacement compensation signal $\tilde{X}_c(s)$ into a voltage compensation signal $\tilde{V}_c(s)$.

A phase compensator 132, which may be implemented as a delay element, all-pass filter, or a combination thereof, may apply phase compensation to predicted voltage signal $\hat{V}(s)$ in order to compensate for phase differences between predicted voltage signal $\hat{V}(s)$ and voltage compensation signal $\hat{V}_c(s)$ that may be introduced by controller 108 in its calculation of voltage compensation signal $\tilde{V}_c(s)$. In addition, a delay element 134 may delay predicted voltage signal $\hat{V}(s)$ to generate delayed predicted voltage signal $\hat{V}_d(s)$ in order to compensate for the delay incident to calculating displacement compensation signal $\tilde{X}_c(s)$ from audio input signal S(s) and converting displacement compensation signal $\tilde{X}_c(s)$ into voltage compensation signal $\tilde{V}_c(s)$.

A combiner 136 may apply delayed predicted voltage signal $\hat{V}_d(s)$ to voltage compensation signal $\tilde{V}_c(s)$, to generate a corrected voltage signal $\overline{V}(s)$. Thus, voltage compensation signal $\tilde{V}_c(s)$ may be applied to audio input signal (e.g., S(s)), or a derivative thereof (e.g., $\hat{V}(s)$, $\hat{V}_d(s)$), to minimize overexcursion of speaker 102.

A gain element 138 may apply a gain $G^{-1}$ (e.g., an analog-to-digital gain) to corrected voltage signal $\overline{V}(s)$ to generate a digital audio signal to be input to amplifier 110, wherein the gain represents an inverse of gain of amplifier 110 and the inverse of gain element 114. In some embodiments, gain element 138 may include a digital-to-analog converter for converting the digital corrected voltage signal $\overline{V}(s)$ to a corresponding analog signal. In other embodiments, amplifier 110 may include a digital-to-analog converter for converting a digital audio signal output by controller 108 into an analog voltage to be driven by amplifier 110 to speaker 102.

FIG. 2 illustrates a flow chart of an example method for speaker protection, in accordance with embodiments of the present disclosure. According to one embodiment, method 200 begins at step 202. Teachings of the present disclosure are implemented in a variety of configurations of system 100. As such, the preferred initialization point for method 200 and the order of the steps comprising method 200 may depend on the implementation chosen.

At step 202, controller 108 may receive audio input signal S(s). At step 204, controller 108 may generate a predicted displacement $\hat{X}(s)$ of speaker 102 by applying a voltage-to-displacement model for speaker 102 (e.g., excursion transfer function $\hat{H}_x(s)$) to the audio input signal or a derivative thereof (e.g., predicted voltage signal $\hat{V}(s)$). At step 206, controller 108 may apply limit $X_{lim}$ in a displacement domain of speaker 102 to predicted displacement $\hat{X}(s)$ to generate a modified predicted displacement $\bar{X}(s)$. At step 208, controller 108 may calculate, in the displacement domain of speaker 102, a difference of predicted displacement $\hat{X}(s)$ and modified predicted displacement $\bar{X}(s)$ as a displacement compensation signal $\tilde{X}_c(s)$. At step 210, controller 108 may filter (e.g., with artifact prevention filter 126), in the displacement domain of speaker 102, audio artifacts from displacement compensation signal $\tilde{X}_c(s)$.

At step 212, controller 108 may perform regularized inversion (e.g., with regularized inversion block 128) on the voltage-to-displacement model for speaker 102 (e.g., excursion transfer function $\hat{H}_x(s)$) to obtain a regularized inverse excursion transfer function (e.g., $\tilde{H}_x^{-1}$ (s) to minimize or avoid over-amplification of audio artifacts that may otherwise occur during conversion of displacement compensation signal $\tilde{X}_c(s)$ into a corresponding voltage compensation signal by a direct inverse (e.g., excursion transfer function $\hat{H}_x^{-1}(s)$) of the voltage-to-displacement model instead of the a regularized inverse excursion transfer function. At step 214, controller 108 may convert displacement compensation signal $\tilde{X}_c(s)$ in the digital domain of speaker 102 into a voltage compensation signal $\tilde{V}_c(s)$ in the voltage domain of speaker 102 by applying an inverse of a voltage-to-displacement model for speaker 102 (e.g., transfer function $\tilde{H}_x^{-1}(s)$ of inversion filter 130) to displacement compensation signal $\tilde{X}_c(s)$.

At step 216, controller 108 may compensate for at least one of a time delay and a phase mismatch (e.g., with phase compensator 132 and/or delay element 134) between a processing path of audio input signal S(s) (e.g., phase compensator 132, delay element 134) and a processing path for generating voltage compensation signal $\tilde{V}_c(s)$ (e.g., filter 116, limiter 120, combiner 124, artifact prevention filter 126, inverse filter 130). At step 218, controller 108 may apply voltage compensation signal $\tilde{V}_c(s)$ to the audio input signal, or a derivative thereof (e.g., delayed predicted voltage signal $\hat{V}_d(s)$), to minimize overexcursion of speaker 102.

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using controller 108 or any other system operable to implement method 200. In certain embodiments, method 200 may be implemented partially or fully in software and/or firmware embodied in computer-readable media.

This disclosure encompasses all changes, substitutions, variations, alterations, and modifications to the example embodiments herein that a person having ordinary skill in the art would comprehend. As a non-limiting example, positions of artifact prevention filter 126 and inverse filter 130 could be reversed, leading to another embodiment of the present disclosure.

Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A controller configured to be coupled to an audio transducer, wherein the controller is further configured to:
- receive an audio input signal;
- calculate, in a displacement domain of the audio transducer, a displacement compensation signal based on the audio input signal by:
  - generating a predicted displacement of the audio transducer by applying a voltage-to-displacement model for the audio transducer to the audio input signal;
  - applying a limit to the predicted displacement to generate a modified predicted displacement; and
- calculating a difference of the predicted displacement and the modified predicted displacement as the displacement compensation signal;
- convert the displacement compensation signal from the displacement domain into a voltage compensation signal in a voltage domain; and
- apply the voltage compensation signal to the audio input signal, or a derivative thereof, to minimize overexcursion of the audio transducer.

2. The controller of claim 1, further configured to filter audio artifacts from the displacement compensation signal before or after converting the displacement compensation signal into the voltage compensation signal.

3. The controller of claim 1, further configured to convert the displacement compensation signal into the voltage compensation signal by applying an inverse of a voltage-to-displacement model for the audio transducer to the displacement compensation signal.

4. The controller of claim 3, further configured to regularize the inverse of a voltage-to-displacement model to minimize over-amplification of audio artifacts during conversion of the displacement compensation signal into the voltage compensation signal.

5. The controller of claim 1, further configured to compensate for at least one of a time delay and a phase mismatch between a processing path of the audio input signal and a processing path for generating the voltage compensation signal.

6. A method comprising:
- receiving an audio input signal;
- calculating, in a displacement domain of an audio transducer, a displacement compensation signal based on the audio input signal, wherein calculating the displacement compensation signal comprises:

generating a predicted displacement of the audio transducer by applying a voltage-to-displacement model for the audio transducer to the audio input signal;

applying a limit to the predicted displacement to generate a modified predicted displacement; and calculating a difference of the predicted displacement and the modified predicted displacement as the displacement compensation signal;

converting the displacement compensation signal from the displacement domain into a voltage compensation signal in a voltage domain; and applying the voltage compensation signal to the audio input signal, or a derivative thereof, to minimize over-excursion of the audio transducer.

7. The method of claim 6, further comprising filtering audio artifacts from the displacement compensation signal before or after converting the displacement compensation signal into the voltage compensation signal.

8. The method of claim 6, further comprising converting the displacement compensation signal into the voltage compensation signal by applying an inverse of a voltage-to-displacement model for the audio transducer to the displacement compensation signal.

9. The method of claim 8, further comprising regularizing the inverse of voltage-to-displacement model to minimize over-amplification of audio artifacts during conversion of the displacement compensation signal into the voltage compensation signal.

10. The method of claim 6, further comprising compensating for at least one of a time delay and a phase mismatch between a processing path of the audio input signal and a processing path for generating the voltage compensation signal.

11. An article of comprising:

a non-transitory computer-readable medium; and computer-executable instructions carried on the computer-readable medium, the instructions readable by a processor, the instructions, when read and executed, for causing the processor to:

receive an audio input signal;

calculate, in a displacement domain of an audio transducer, a displacement compensation signal based on the audio input signal, wherein calculating the displacement compensation signal comprises:

generating a predicted displacement of the audio transducer by applying a voltage-to-displacement model for the audio transducer to the audio input signal;

applying a limit to the predicted displacement to generate a modified predicted displacement; and calculating a difference of the predicted displacement and the modified predicted displacement as the displacement compensation signal;

convert the displacement compensation signal from the displacement domain into a voltage compensation signal in a voltage domain; and apply the voltage compensation signal to the audio input signal, or a derivative thereof, to minimize overexcursion of the audio transducer.

12. The article of claim 11, the instructions for further causing the processor to filter audio artifacts from the displacement compensation signal before or after converting the displacement compensation signal into the voltage compensation signal.

13. The article of claim 11, the instructions for further causing the processor to convert the displacement compensation signal into the voltage compensation signal by applying an inverse of a voltage-to-displacement model for the audio transducer to the displacement compensation signal.

14. The article of claim 13, the instructions for further causing the processor to regularize the inverse of voltage-to-displacement model to minimize over-amplification of audio artifacts during conversion of the displacement compensation signal into the voltage compensation signal.

15. The article of claim 11, the instructions for further causing the processor to compensate for at least one of a time delay and a phase mismatch between a processing path of the audio input signal and a processing path for generating the voltage compensation signal.

* * * * *